(12) United States Patent
Onda et al.

(10) Patent No.: US 7,748,539 B2
(45) Date of Patent: Jul. 6, 2010

(54) PACKAGED BODY

(75) Inventors: Takehito Onda, Itoigawa (JP); Seiya Nakamura, Itoigawa (JP)

(73) Assignee: Shin-Etsu Polymer Co., Ltd., Chuo-Ku, Tokyo (JP)

( * ) Notice: Subject to any disclaimer, the term of this patent is extended or adjusted under 35 U.S.C. 154(b) by 31 days.

(21) Appl. No.: 12/084,905

(22) PCT Filed: Oct. 11, 2006

(86) PCT No.: PCT/JP2006/320319

§ 371 (c)(1),
(2), (4) Date: May 13, 2008

(87) PCT Pub. No.: WO2007/058034

PCT Pub. Date: May 24, 2007

(65) Prior Publication Data
US 2009/0166248 A1 Jul. 2, 2009

(30) Foreign Application Priority Data
Nov. 16, 2005 (JP) ............................. 2005-331869

(51) Int. Cl.
*B65D 85/30* (2006.01)
*B65D 81/33* (2006.01)
(52) U.S. Cl. .................. 206/591; 206/521; 206/588; 206/585; 206/592; 206/710
(58) Field of Classification Search ............... 206/587, 206/521, 523, 588, 585, 591, 592, 594, 454, 206/710, 711
See application file for complete search history.

(56) References Cited

U.S. PATENT DOCUMENTS 4,640,418 A * 2/1987 Lowry ...................... 206/499

(Continued)

FOREIGN PATENT DOCUMENTS

JP 2000-159288 A 6/2000

(Continued)

OTHER PUBLICATIONS

International Search Report for PCT/JP2006/320319 dated Dec. 26, 2006.

(Continued)

*Primary Examiner*—David T Fidei
(74) *Attorney, Agent, or Firm*—Buchanan Ingersoll & Rooney PC

(57) ABSTRACT

A packaged body includes: a prism-shaped packaging box 1 having a bottom; a pair of top and bottom shock absorbers 30 accommodated inside packaging box 1 for sandwiching a substrate storage container 10; elastic members 50 disposed between substrate storage container 10 and each shock absorber 30; and reinforcements 60 for reinforcing each of shock absorbers 30. Further, shock absorber 30 is formed as a shock absorbing element 31 that fits substrate storage container 10, a surrounding wall 32 of the shock absorbing element 31 is constructed of an inner wall 35 that is bent and formed along the periphery of shock absorbing element 31, a protrusion 36 that is formed from inner wall 35 so as to project outwards and an outer wall 37 that is formed from protrusion 36 so as to be spaced from, and oppose, inner wall 35 of shock absorbing element 31.

8 Claims, 10 Drawing Sheets

U.S. PATENT DOCUMENTS

| | | | |
|---|---|---|---|
| 5,706,951 A * | 1/1998 | Oinuma et al. | 206/710 |
| 6,082,540 A * | 7/2000 | Krampotich et al. | 206/445 |
| 6,155,027 A * | 12/2000 | Brooks | 53/434 |
| 6,405,873 B2 * | 6/2002 | Koike | 206/592 |
| 6,591,987 B2 * | 7/2003 | Wu et al. | 206/454 |
| 6,877,608 B2 * | 4/2005 | Koike | 206/592 |
| 7,017,749 B2 * | 3/2006 | Yajima et al. | 206/711 |
| 7,117,993 B2 * | 10/2006 | Koike | 206/320 |
| 7,328,800 B2 * | 2/2008 | Koike | 206/521 |
| 7,464,517 B2 * | 12/2008 | Akatsuka et al. | 53/433 |
| 2001/0020595 A1 * | 9/2001 | Koike | 206/521 |
| 2003/0234207 A1 * | 12/2003 | Koike | 206/588 |
| 2005/0109666 A1 * | 5/2005 | Eggum | 206/710 |
| 2005/0236298 A1 | 10/2005 | Schwenk et al. | |
| 2005/0252827 A1 * | 11/2005 | Tieben et al. | 206/710 |

FOREIGN PATENT DOCUMENTS

| | | |
|---|---|---|
| JP | 2002-160769 A | 6/2002 |
| JP | 2003-063569 A | 3/2003 |
| JP | 2003-63569 A | 3/2003 |
| JP | 2003-174081 A | 6/2003 |
| JP | 2003-174084 A | 6/2003 |
| JP | 2004-168324 A | 6/2004 |
| JP | 2005-041503 A | 2/2005 |

OTHER PUBLICATIONS

Notification of Transmittal of Translation of the International Preliminary Report on Patentability (Form PCT/IB/338), International Preliminary Report on Patentability (Form PCT/IB/373), Written Opinion of the International Search Authority (Form PCT/ISA/237) mailed in corresponding International Patent Application No. PCT/JP2006/320319, Oct. 11, 2008, The International Bureau of WIPO, Geneva, CH.

* cited by examiner

PACKAGED BODY

TECHNICAL FIELD

The present invention relates to a packaged body for use in packaging a content item such as a substrate storage container or the like.

BACKGROUND ART

Recently, 300 mm (12 inch) type semiconductor wafers have become predominant instead of those of 200 mm (8 inch) type. For transportation of this type, large-sized dedicated substrate storage containers have been used. This substrate storage container includes, though unillustrated, a container body of a front-open box type for accommodating a plurality of semiconductor wafers and a door element for opening and closing the open front of the container body, and is packaged in a packaged body to be transported (see patent documents 1 and 2).

The door element is formed in, for example a laterally long rectangular shape having its rear side hollowed in the center area, where an approximately rectangular front retainer for elastically holding the front rims of the semiconductor wafers held in the container body is attached with its length vertically oriented. The door element is adapted to be automatically attached to or removed from the container body by means of dedicated door element opening closing equipment (standardized by SEMI standards E62, E63 etc.) (see patent document 3).

The packaged body includes, for example a packaging box of corrugated paperboard or the like and a pair of shock absorbers arranged in the packaging box for sandwiching the substrate storage container from its top and bottom, and is required such as not to cause any damage to the semiconductor wafers and the substrate storage container when it is naturally dropped from 1.0 m or higher or preferably 1.5 m or higher, in drop test. Each shock absorber is formed of a sheet material with an accommodating hollow fitting the top or bottom part of the substrate storage container.

Patent Document 1:
  Japanese Patent Application Laid-open 2000-159288
Patent Document 2:
  Japanese Patent Application Laid-open 2002-160769
Patent Document 3:
  Japanese Patent Application Laid-open 2003-174081

DISCLOSURE OF INVENTION

Problems to be Solved by the Invention

Since the conventional packaged bodies are simply formed so that the substrate storage container is packaged in a corrugated box with shock absorbers simply placed as above, there is the problem that they not a little hinder the substrate storage container during transportation. Describing this point, the door element of the substrate storage container has an approximately rectangular front retainer attached thereto. Since this front retainer is attached to the hollowed center on the interior side of the door element, it is convenient for automatic opening and closing of the door element without increasing the thickness dimension of the door element, however its support semiconductor wafers with narrow areas so that the stroke for holding the semiconductor wafers is short.

When this substrate storage container with such a front retainer is packaged in the conventional packaged body, it is impossible to sufficiently absorb external impacts when it is dropped, hence there is a fear of the corners or ridges of the packaged body becoming easily damaged. Accordingly, the conventional packaged body if it falls from a height of 0.8 m or greater may undergo breakage of semiconductor wafers and/or increase of particle, giving rise to a serious problem that it is not suitable for transportation of a substrate storage container.

To solve the above problem, a method of reinforcing the packaged body using expanded polystyrene, urethane foam and the like as a shock absorbing element can considered. However, the shock absorbing element is large in bulk density, so that there is a fear of making the size of the packaged body greater. Further, since the shock absorbing element is easy to damage at edges, there occurs the problem that broken pieces of the material crushed due to breakage pollute the clean room of the factory.

Also, since the shock absorbing element is large in volume and has large contact areas with the packaged body and the substrate storage container, it is liable to transfer vibrations. As a result there occurs the problem that the semiconductor wafers kept in the container body are turned accidentally. Further, the shock absorbing element can not be kept stacking, hence needs a large storage space, causing a fear of hindering reuse or recycling.

The present invention has been devised in view of the above, it is an object of the present invention to provide a packaged body that is suitable for transportation of content items such as substrate storage containers or the like without causing enlargement of the packaged body in size and can suppress the fear of pollution of its surroundings, enlargement of the storage space and hindrance in reusing and recycling.

Means for Solving the Problems

In order to solve the above problems, the present invention is a structure that accommodates a content item in a packaging box and includes: a plurality of shock absorbers accommodated in the packaging box for holding the content item therebetween; and a reinforcement for reinforcing at least one shock absorber of the multiple shock absorbers.

Here, the packaging box can be formed in an approximate box shape, and the plural shock absorbers can comprise a pair of shock absorbers that sandwich a content item or items from the top and bottom.

Further, the packaging box can be formed in an approximate box shape with a bottom, and the plural shock absorbers can comprise a pair of shock absorbers that sandwich a content item or items from the horizontal direction (from the front and rear sides or from the left and right sides).

Further, it may further include an elastic member that is interposed between the content item and at least one shock absorber.

One of the shock absorber and elastic member is formed with a recess and the other is formed with a projection so that these recess and projection can be detachably fitted to each other.

Also, the shock absorber is formed with recesses or projections so as to make these recesses or projections hold the elastic member.

Further, the content item may be a substrate storage container which is constructed such that an opening portion of a container body for accommodating semiconductor wafers is opened and closed by a door element, and a retainer for holding the rims of semiconductor wafers is attached to the door element of the substrate storage container.

It is preferred that the shock absorber is formed as a shock absorbing element that fits the content item, the surrounding wall of the shock absorbing element is constructed of an inner wall that is formed along the periphery of the shock absorbing element, a protrusion that is formed from the inner wall so as to project outwards and an outer wall that is formed from the protrusion so as to be spaced from, and oppose, the inner wall of the shock absorbing element, and the peripheral part of the reinforcement is bent so as to engage (mesh or interlock) the outer wall edge of the shock absorbing element.

Alternatively, the surrounding wall of the shock absorber is adapted to support the peripheral part of the elastic member while the other part than the peripheral part of the elastic member is bent into the shock absorbing element to form an integrated configuration.

Also, a plurality of indented portions may be arranged apart from each other and formed in the surrounding wall of the shock absorbing element, along the circumferential direction It is also possible to fold the protrusion of the surrounding wall of the shock absorbing element to form bellows.

It is also possible to fold the portion other than the protrusion of the surrounding wall of the shock absorbing element to form bellows.

It is also possible to format least one projected portion in the bottom face of the reinforcement.

It is also possible to gradually vary the folded lengths of the bellows from the inward to the outward of the shock absorber.

The surrounding wall of the shock absorber is adapted to hold a plurality of reinforcements, so that each reinforcement can be folded back inwards so as to be retracted into the rear side of the shock absorber and fitted in layers to the rear side of the shock absorber at the time of packaging.

Also, a structure may include: a plurality of shock absorbers accommodated in a packaging box; a reinforcement for reinforcing at least one shock absorber of the plural shock absorbers; and a storage container held between the plural shock absorbers, wherein the shock absorber is given as a shock absorbing element of a form having an approximately dish-like section that fits on the storage container while the surrounding wall of this shock absorbing element is constructed of an inner wall that is bent and formed along the periphery of the shock absorbing element, a protrusion that is formed from the inner wall so as to project outwards and an outer wall that is formed from the protrusion so as to be spaced from, and oppose, the inner wall of the shock absorbing element, and the reinforcement is formed into an approximately sectionally dish-like shape (the term "approximately sectionally dish-like shape" at least includes a form having an approximately angled U-shaped section and a form having an approximately U-shaped section) so that its peripheral part is adapted to engage the outer wall edge of the shock absorbing element, and the structure may be characterized in that the storage container is configured of a container body for storing precision substrates and a door element that opens and closes the opening of this container body.

Here, the storage container may be formed of a container body for storing precision substrates and a door element that opens and closes the opening of this container body, and a retainer that holds the accommodated precision substrates at their rims may be attached to this door element.

Further, the storage container may include: a container body for storing precision substrates; a door element that opens and closes the opening of this container body; and locking mechanisms that are mounted in this door element, cause engaging claws that are projected from the peripheral part of the door element to fit into engagement holes in the inner periphery of the opening of the container body when the door element is fitted to the container body and cause the engaging claws fitted in the engagement holes of the container body to return to the original positions when the door element is removed from the container body, and a retainer that holds the accommodated precision substrates at their rims may be attached to this door element.

Another structure may include: a plurality of shock absorbers accommodated in a packaging box; a reinforcement for reinforcing at least one shock absorber of the plural shock absorbers; and a storage container held between the plural shock absorbers, wherein the shock absorber is given as a shock absorbing element that fits on the storage container while the surrounding wall of this shock absorbing element is constructed of an inner wall that is bent and formed along the periphery of the shock absorbing element, a protrusion that is formed from the inner wall so as to project outwards and an outer wall that is formed from the protrusion so as to be spaced from, and oppose, the inner wall of the shock absorbing element, and the peripheral part of the reinforcement is bent in its thickness direction so as to engage the outer wall edge of the shock absorbing element, and the structure may be characterized in that the storage container is constructed of a tubular container body having a bottom, an inner box that is detachably accommodated into this container body for storing precision substrates and a door element for opening and closing the open top of the container body.

It is noted that an elastic pressing plate (retainer) for holding the upper rims of the stored precision substrates may be attached inside the door element.

Here, it is possible to insert a separate shock absorber or absorbers between the packaging box and the content item in the claims. The packaging box may be a corrugated box if there is not any particular problem arising, or may be a dedicated plastic box with a lid, and there is no particular concern about a double-layered, triple-layered structure or the like. The opening of this packaging box may be arranged on any side, not limited to the top, front and side portions.

Examples of content items may at least include a single or a plurality of substrate storage containers, daily-use utensils, merchandise goods, mechanical goods, various kinds of cases and cassettes for electrical and electronic, chemical, semiconductor applications. The content item may be directly held between a plurality of shock absorbers or may be held therebetween in the state in which it is wrapped with wrapping paper or a wrapping bag. When this content item is a transparent, opaque or translucent substrate storage container, examples may at least include types for storing 200 mm semiconductor wafers (precision substrates), types (FOSB, FOUP types, open cassette, wafer carrier and the like) for storing 300 mm semiconductor wafers (precision substrates), types for storing 450 mm semiconductor wafers.

The shock absorbing element as the shock absorber may be formed with recess(es) and/or projection(s) to improve rigidity and strength. The surrounding wall of this shock absorbing element may be provided in an approximately keystone plate form, approximately hut-like shape, and approximately box-GANBURI form, approximately GANBURI form (kinds of Japanese roofing tiles) and the like.

Though it is preferable that the inner wall, protrusion and outer wall of the surrounding wall are integrally formed of an identical material such as a resin etc., they may be formed of different materials, and an elongate piece may be extended outwards from the edge of the outer wall. In order to construct the protrusion of the surrounding wall in the form of bellows, the protrusion may be folded in a continuous wavy form or in a continuous mountain-shaped form in the circumferential direction or inward-to-outward direction of the surrounding wall. The elastic member(s) should not be particularly limited as to either singular or plural, or as to whether it should have a plate-like, bag-like or any other configuration.

According to the present invention, since the content item is packaged in a packaging box at least with a shock absorber and a reinforcement interposed therebetween, it is possible to efficiently absorb external forces and impacts that act on the packaged body, hence it is possible to prevent the corners and ridges of the packaged body from becoming easily damaged upon collision or being dropped.

Effect of the Invention

The present invention is suitable for transportation of content items such as substrate storage containers etc., and effective in avoiding enlargement of the packaged body. Further, it is possible to suppress the fear of pollution of the surroundings, enlargement of the storage space and hindrance in reusing and recycling.

Further, when an elastic member inserted between the content item and at least one shock absorber is provided, it is possible for the elastic member to alleviate the impacts that act on the content item and to lower the acceleration upon being dropped.

Further, when the content item is a substrate storage container which is constructed such that its opening of the container body for accommodating semiconductor wafers is opened and closed by a door element, if, for example, a substrate storage container with a front retainer is packaged, it is possible to properly absorb impacts when the package collides or is dropped, hence it is possible to efficiently exclude the possibility of the corners and ridges of the packaged body becoming easily damaged.

Also, when the peripheral part of the reinforcement is bent so as to engage the outer wall edge of the shock absorbing element, it is possible to suppress the surrounding wall of the shock absorbing element from falling down inwards or outwards or deforming, resultantly protect the content item carefully.

Also, when a plurality of indentations are formed in the circumference direction in the surrounding wall of the shock absorbing element, it is possible to enhance the strength and rigidity of the shock absorber.

Further, if the protrusion of the surrounding wall of the shock absorbing element is folded to form flexible bellows, the bellows can expand and contract and flex, so that it is possible to alleviate the impacts acting on the content item and decrease the acceleration arising at the time of falling.

Figure 1:
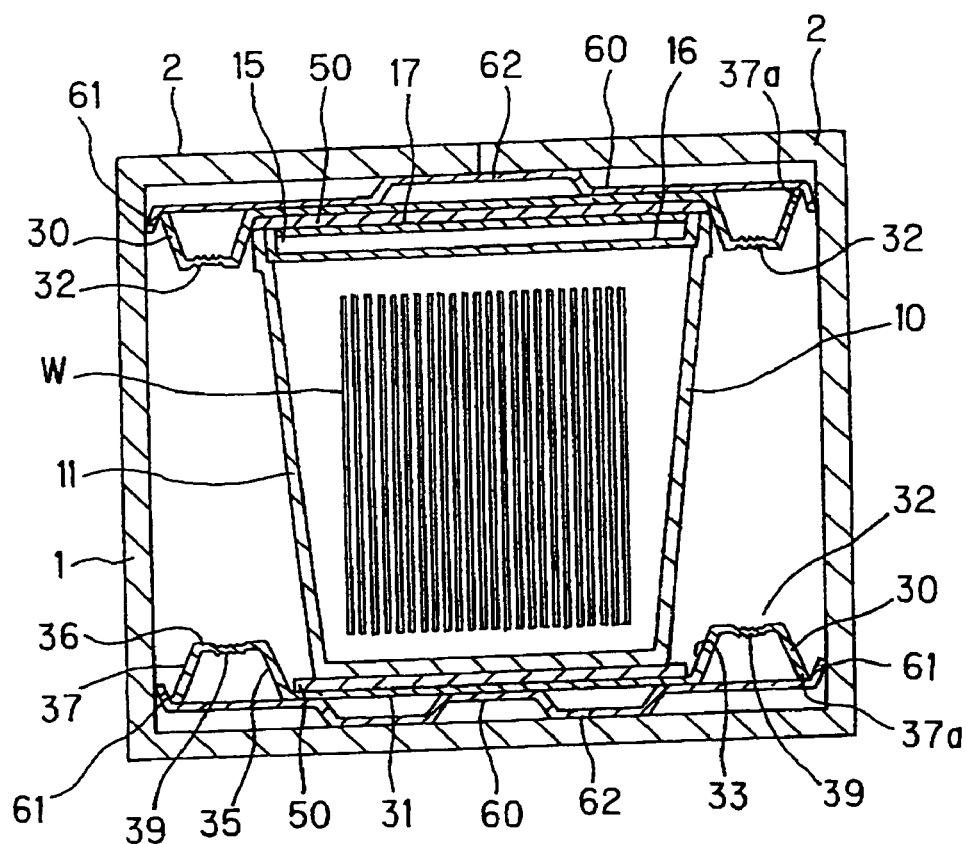
FIG. 1 is a sectional illustrative view schematically showing an embodiment of a packaged body according to the present invention.

DESCRIPTION OF REFERENCE NUMERALS 1 packaging box
10 substrate storage container (content item)
11 container body
11A container body
14 teeth
15 door element
15A door element
19 front retainer (retainer)
22 locking mechanism
26 inner box
28 pressing plate
30 shock absorber
31 shock absorbing element
32 surrounding wall
33 hollowed portion
34 passage opening
35 inner wall
36 protrusion
37 outer wall
37a outer wall edge
38 stepped indentation (indentation)
39 bellows
40 reinforcement
41 hinge
42 gutter-shaped plate
43 reinforcing plate
44 rib
50 elastic member
52 fitting fastener
60 reinforcement
61 peripheral part
W semiconductor wafer

BEST MODE FOR CARRYING OUT THE INVENTION

Referring now to the drawings, a preferred embodiment mode of the present invention will be described. A packaged body in the present embodiment includes: as shown in FIGS. 1 to 6, a top-open prism-shaped packaging box 1 having a bottom; a pair of top and bottom shock absorbers 30 accommodated inside packaging box 1 to hold a substrate storage container 10 therebetween; a pair of elastic members 50 disposed between substrate storage container 10 and each shock absorber 30, and a pair of reinforcements 60 reinforcing each shock absorber 30 from outside by covering in lamination thereof, so that substrate storage container 1 can be transported in safety while it is protected by shock absorbers 30, elastic members 50 and reinforcements 60.

Figure 2:
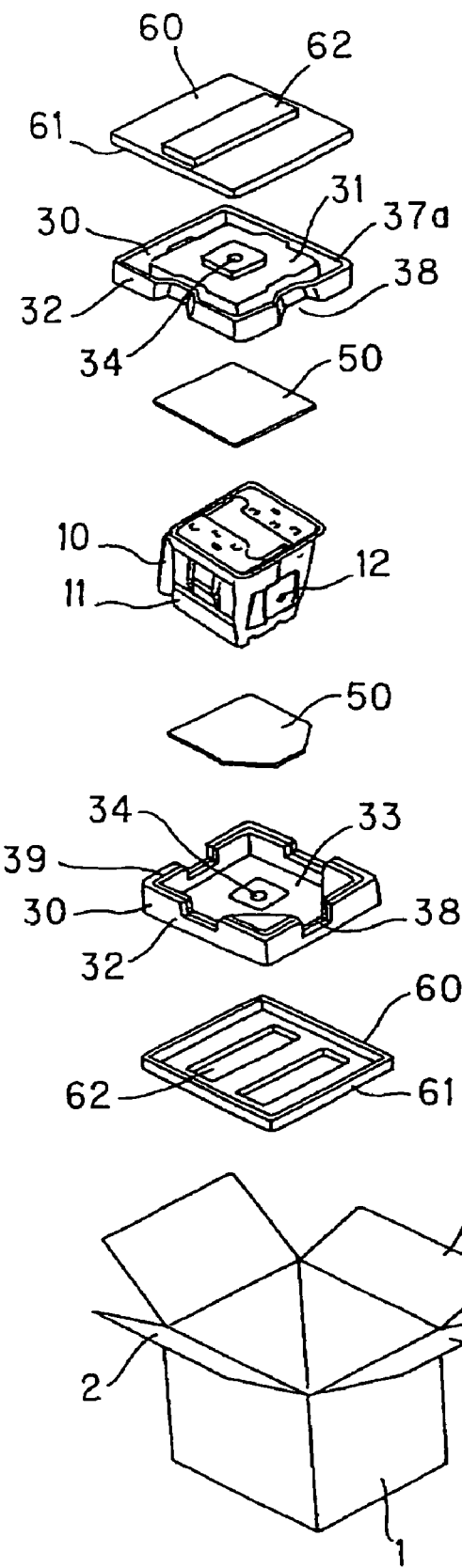
FIG. 2 is an exploded perspective illustrative view showing a packaged state in an embodiment of a packaged body according to the present invention.

As shown in FIGS. 1 and 2, packaging box 1 is formed of a predetermined material for the exterior that can store a predetermined number of substrate storage containers 10. As the predetermined material of this packaging box 1, plastic resins such as polyethylene, polypropylene and the like, foamed materials such as polyurethane, polyolefin and the like can be listed for instance. Of these, plastic resins which are convenient for recycling and less pollute the clean room with paper particles etc., are preferred. Packaging box 1 is formed having a plurality of flaps 2 that open and close the top, butted to one another, with a less size of the material, hence presenting excellent characteristics in economy, productivity and strength.

Substrate storage container 10 is comprised of: as shown in FIGS. 1, 3 to 5, a container body 11 for accommodating a plurality of (25 or 26) semiconductor wafers W of 300 mm in diameter, arranged in alignment; a door element 15 that can be attached and detached to open and close the open front of this container body 11; and a pair of left and right locking mechanisms 22 that are mounted side by side in this door element 15, each cause engaging claws 21 that are projected from the peripheral part of door element 15 to fit into a plurality of engagement holes in the inner periphery on the front side of container body 11 by the control of rotary plate 20 when door element 15 is fitted to container body 11, and each cause engaging claws 21 fitted in respective engagement holes of container body 11 to return to the original basic positions by the control of rotary plate 20 when door element 15 is removed from container body 11.

Substrate storage container 10 when it has stored no semiconductor wafer W in container body 11 is wrapped by an unillustrated polyethylene wrapping bag and accommodated upright. In contrast, when semiconductor wafers W are stored in container body 11 (see FIG. 1), the container is put in and wrapped by the polyethylene wrapping bag, then further wrapped with an aluminum wrapping bag as required and accommodated upright.

Container body 11 is formed of a predetermined resin in a front-open box type having a robotic flange 12 of a square shape, viewed from top, detachably mounted in the center on the top thereof. This robotic flange 12 is held by an automatic transporter called an OHT (overhead hoist transfer) so that substrate storage container 10 will be conveyed through the processes.

Figure 3:
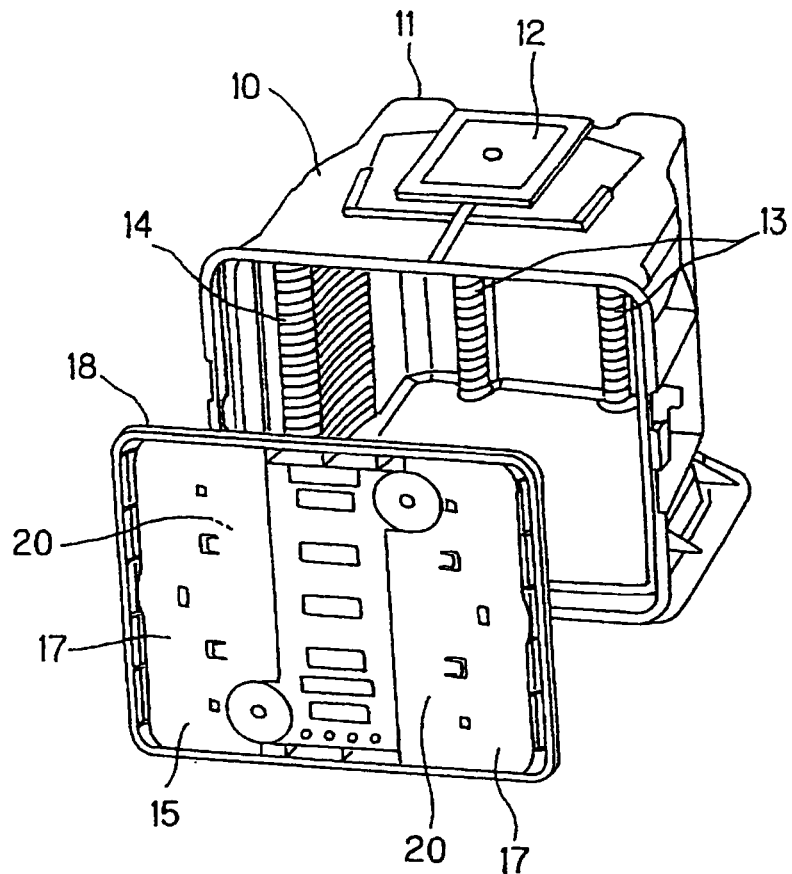
FIG. 3 is an exploded perspective illustrative view showing a substrate storage container in an embodiment of a packaged body according to the present invention.

As shown in FIG. 3, a pair of left and right rear retainers 13 for holding the interior side rims of accommodated semiconductor wafers W are arranged vertically on the interior surface on the backside wall of container body 11 while plural pairs of teeth 14 for horizontally supporting semiconductor wafers W at their side rims are arranged vertically on the interior surface on both side walls of container body 11.

Figure 4:
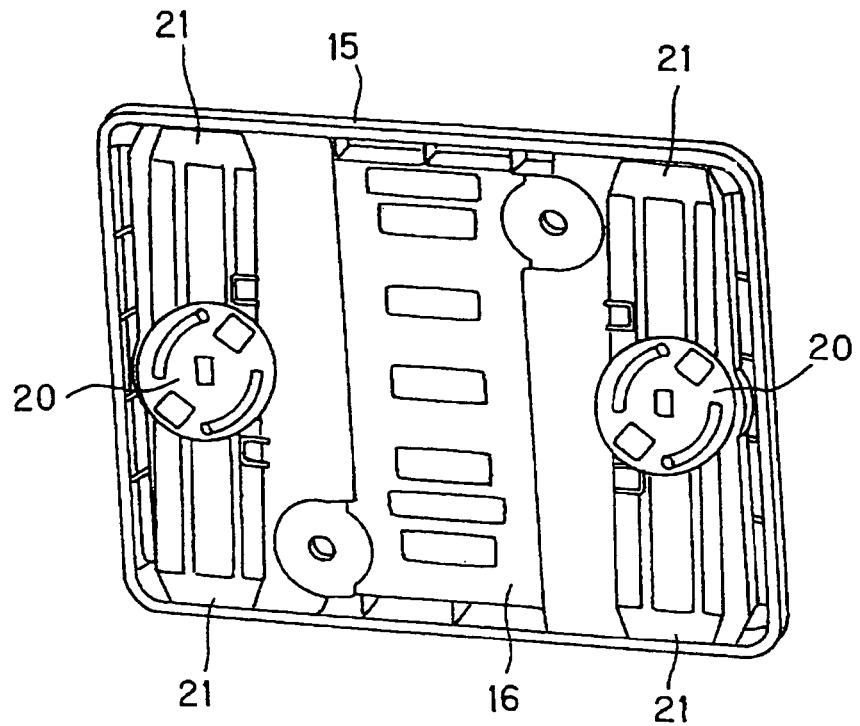
FIG. 4 is a perspective illustrative view showing a door element in an embodiment of a packaged body according to the present invention.
Figure 5:
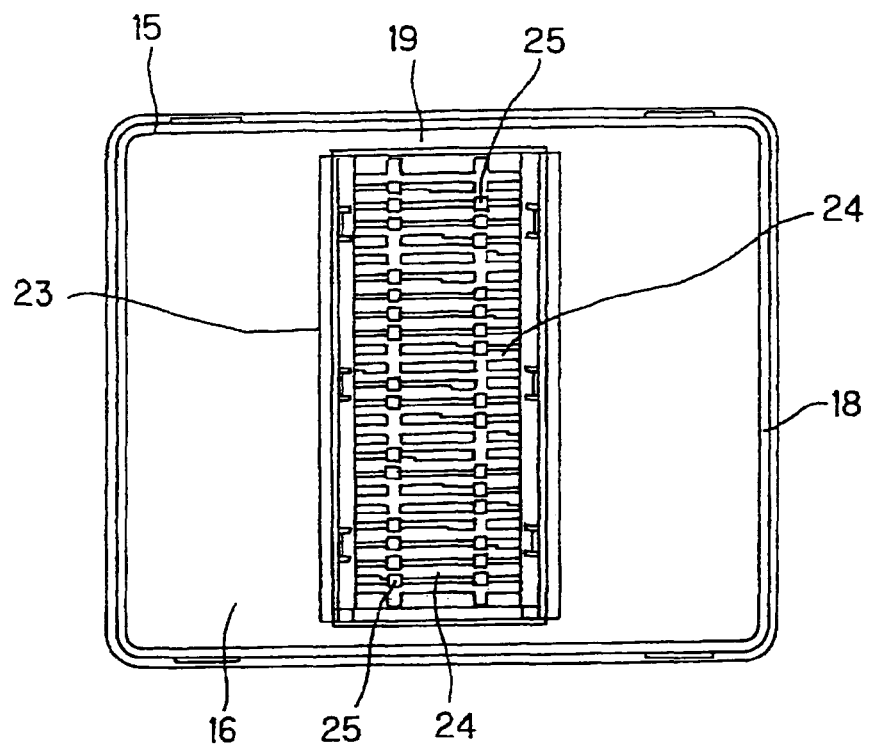
FIG. 5 is an illustrative view showing a front retainer on the interior side of a door element in an embodiment of a packaged body according to the present invention.

As shown in FIGS. 3 to 5, door element 15 is constructed such that a laterally long rectangular casing body 16 and plate 17 made of a predetermined resin are assembled in combination with a deformable endless seal gasket 18 fitted on its periphery while a large-sized front retainer 19 for elastically holding the front rims of accommodated semiconductor wafers W is vertically attached in the center of the rear side.

As shown in FIG. 5, front retainer 19 includes: a vertically long rectangular frame 23 detachably mounted in the center on the rear side of casing body 16; a plurality of resilient pieces 24 supported between both the side ends of frame 23 and arranged vertically with a clearances from one to another; and holding blocks 25 formed on each resilient piece 24 for holding the front rim of semiconductor wafer W by means of a V-shaped groove or a U-shaped groove. The frame 23, plural resilient pieces 24 and plural holding blocks 25 are integrally molded of resin. Each resilient piece 24 is molded into an elastic form having an approximately dish-like section or into a tray-like form while plural holding blocks 25 are selectively integrated at both side ends and/or in the center.

As shown in FIGS. 1 and 2, each shock absorber 30 is formed into a shape having an approximately dish-like section or approximately tray-like by forming a predetermined plastic sheet using vacuum forming, pressure forming, press-forming or the like, and is arranged between substrate storage container 10 and reinforcement 60 to protect substrate storage container 10. This shock absorber 30 is formed of a sheet of about 0.5 to 2.0 mm, preferably 0.7 to 1.5 mm thick, made of polyolefin resin, polystyrene resin or the like, and added with an antistatic agent and various additives, if required.

Shock absorber 30 has a shock absorbing element 31 having an approximately rectangular shape, viewed from top and fitting the upper or lower part of substrate storage container 10 while a surrounding wall 32 of shock absorbing element 31 are bent and formed in a double layered structure of interior and exterior walls, forming an approximately keystone plate (grooving steel sheet) form. As shown in FIG. 2, this shock absorbing element 31 has a hollowed portion 33 of an approximately polygonal shape, viewed from top, which loosely fits the upper or lower part of substrate storage container 10. In the center of this hollowed portion 33, a pit hole of a rectangular shape, viewed from top, for enhancing the strength is optionally indented while a round passage opening 34 is formed in the center of this pit hole.

As shown in FIG. 1, surrounding wall 32 of shock absorbing element 31 is formed of an inner wall 35 that is bent and extended from the peripheral portion of shock absorbing element 31, obliquely and outwards on its surface side to section hollowed portion 33 and closely cover substrate storage container 10, a protrusion 36 that is integrally formed from the end of inner wall 35 and is projected horizontally outwards and an external wall 37 that is bent back obliquely and outwards from the end of the protrusion 36 and arranged opposing, and spaced from, inner wall 35 of shock absorbing element 31. This external wall 37 is positioned close to the interior surface of the peripheral wall of packaging box 1.

As shown in FIG. 2, in surrounding wall 32 of shock absorbing element 31a plurality of stepped indentations 38 are arranged apart from each other along the circumference so that these stepped indentions 38 have surrounding wall 32 projected and indented, functioning to increase the strength of shock absorber 30. Further, the whole or part of flat protrusion 36 of surrounding wall 32 is folded into continuous wavy pleats in the inward-to-outward direction of shock absorbing element 31, forming a plurality of elastic bellows 39 that enclose substrate storage container 10 so as to absorb and alleviate impacts when the packaged body is dropped, as each bellows 39 expands and contracts. These multiple bellows 39 are disposed in stepped indentations 38 and other portions in surrounding wall 32 so that they may be located at different heights.

Each elastic member 50 is given as a sheet having a rectangular or polygonal shape, viewed from top and formed of polyurethane or foamed polyolefin resin or the like with a thickness of about 3 to 20 mm, for example, and is accommodated inside shock absorbing element 31 of each shock absorber 30 as shown in FIGS. 1 and 2, functioning to absorb impacts a rising when the packaged body is dropped. Generally, the thicker this elastic member 50 is, the better the cushioning performance will be. However, if it is excessively thick, the size of packaging box 1 becomes greater, differing from the size of the packaging box 1 being standardized. Accordingly, the elastic member is preferably formed to be as thick as possible within the standard size.

Herein, elastic member 50 is usually formed as a flat sheet as shown in FIG. 2 but the elastic member should not be limited to this. That is, elastic member 50 may be formed in a wavy or bellows-like form, or in a form having partial steps or in any other shape, as necessary.

As shown in FIGS. 1 and 2, each reinforcement 60 is formed into a form having an approximately dish-like section or into an approximately tray-like form by forming a sheet similar to that of shock absorber 30 using vacuum forming, pressure forming, press-forming or the like so as to be marginally greater than shock absorber 30, and is layered on the rear side of shock absorber 30 to cover the open space between inner wall 35 and outer wall 37.

Reinforcement 60 has a peripheral part 61 that is extended toward substrate storage container 10, in other words, bent obliquely in the thickness direction so that it is snugly held between the inner surface of the peripheral wall of packaging box 1 and an outer wall edge 37a of shock absorber 30 and also fits and abuts outerwall edge 37a of shock absorbing element 31 from the outer side to prevent shock absorbing element 31 from spreading or deforming. Around the center of reinforcement 60, a necessary number of elongated projections 62 having an approximately U-shaped section are formed. This projection 62 functions to secure the stored position and rigidity of reinforcement 60 placed in packaging box 1.

According to the above, substrate storage container 10 is packed by layering shock absorbers 30, elastic members 50 and reinforcements 60 in a multi-layered structure so as to markedly improve shock absorbing performance, instead of simply packing it with shock absorbers 30 in packaging box 1. Accordingly, if, for example, a substrate storage container 10 with front retainer 19 is packaged, it is possible to sufficiently absorb impacts when it is dropped, hence there is no fear of the corners and ridges of the packaged body becoming easily damaged. As a result, if it is dropped from a height of 0.8 m or greater, it will not undergo breakage of semiconductor wafers W and increase of particle hence can convey substrate storage container 10 in safety.

Further, since the shock absorbing performance is improved, even if drop test from 150 cm, which was previously considered to be difficult for the conventional packaged body to deal with, is done, it is possible to solve the problems of semiconductor wafers W being damaged, dislodging from teeth 14 and increase of particles. Additionally, it is also possible to positively prevent semiconductor wafers W from being turned and polluted if a vibration test is done. Further, since there is no need of conventional shock absorbers made from expanded polystyrene, urethane foam or the like, the size of the packaged body and packaging box 1 will not become bulky.

Since it is also possible to omit the conventional shock absorbing element, there is no fear of the clean room in the factory being polluted with broken pieces of the shock absorbing element from its edges. Further, there is no fear of semiconductor wafers W stored in container body 11 being rotated due to transfer of vibrations through the shock absorbing element that is put in contact with packaging box 1 and substrate storage container 10. Moreover, since shock absorber 30, elastic member 50 and reinforcement 60 have definite forms that are not bulky, these can be kept stacking. It is hence possible to expect a great deal of space saving, reusing and recycling of them and sharply cut down transportation cost.

Further, since peripheral part 61 of reinforcement 60 that covers shock absorber 30 functions as a stopper as it fits and abuts outer wall edge 37a of swayable outer wall 37 of shock absorbing element 31, it is possible to markedly improve the strength at the corners of the packaged body. It is hence possible to reliably prevent shock absorber 30 from spreading and deforming at its corners and lowering its shock absorbing performance when the packaged body is dropped. Since it is also possible to obtain excellent shock absorbing function using a simple combination of reinforcement 60 and shock absorber 30 by covering the former over the latter, the conventional packaging box 1 or the like can be used as it is.

Figure 6:
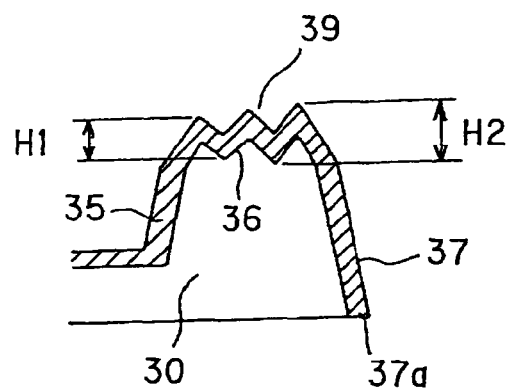
FIG. 6 is a sectional illustrative view showing a variational example of a bellows in an embodiment of a packaged body according to the present invention.

Moreover, in addition to a simple formation of bellows 39 in the inward-to-outward direction of shock absorber 30, it is also possible to form the bellows 39 such that the differential heights H1 and H2 between top and bottom of bellows 39 become gradually greater from the inward to the outward of shock absorber 30 as shown in FIG. 6. With this structure, it is possible to change the compressive force stepwise or flex the area where the compressing force is low, to thereby attenuate and receive an impact at the area where the compressive force is high.

Figure 7:
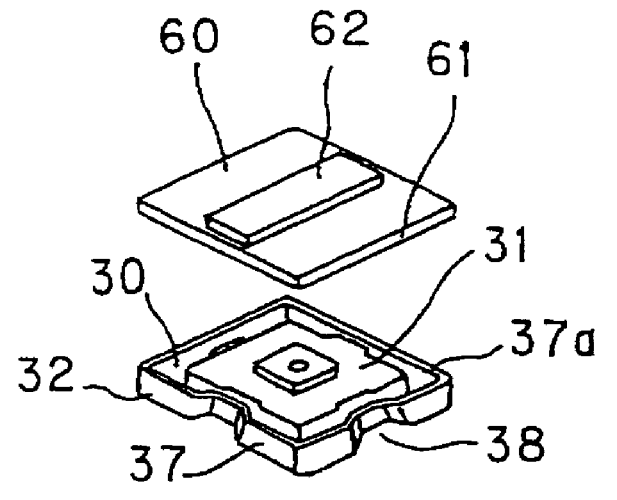
FIG. 7 is an exploded perspective illustrative view showing a packaged state in the second embodiment of a packaged body according to the present invention.
Figure 7:
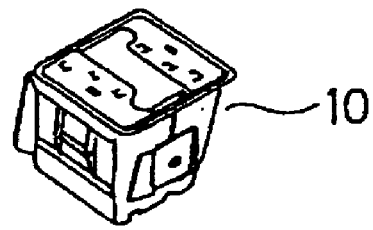
Figure 7:
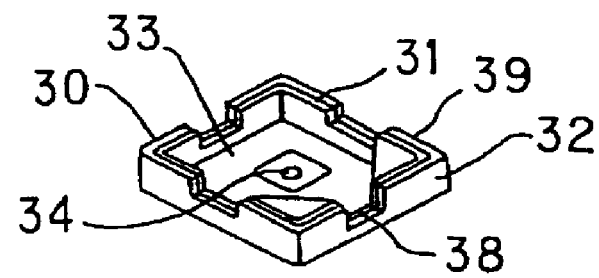
Figure 7:
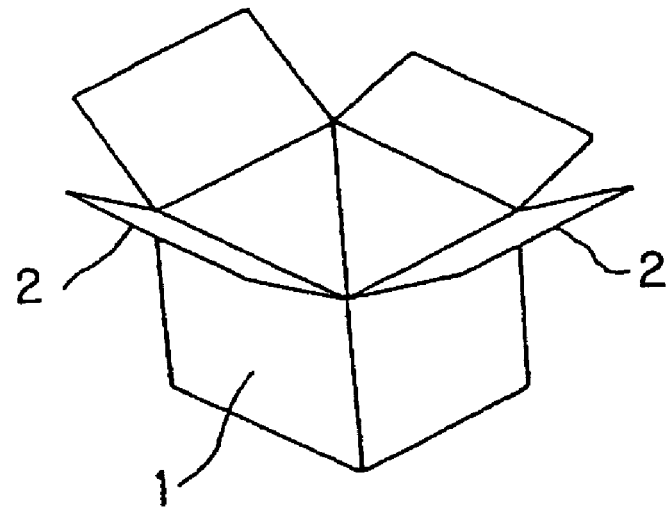

Next, FIG. 7 shows the second embodiment of the present invention. In this case, a pair of elastic members 50 and the lower reinforcement 60 located at the bottom of packaging box 1 are omitted. Other parts are the same as in the above embodiment so that description is omitted.

Also in the present embodiment, the same operation and effect as in the above embodiment can be expected. In addition, even if the lower reinforcement 60 is omitted, the upper reinforcement 60 will firmly reinforce the shock absorber 30 fitted on the door element side, the top of substrate storage container 10, hence it is obvious that a sufficient shock absorbing performance can be obtained. It is also possible to reduce the number of parts and cut down the cost.

Figure 8:
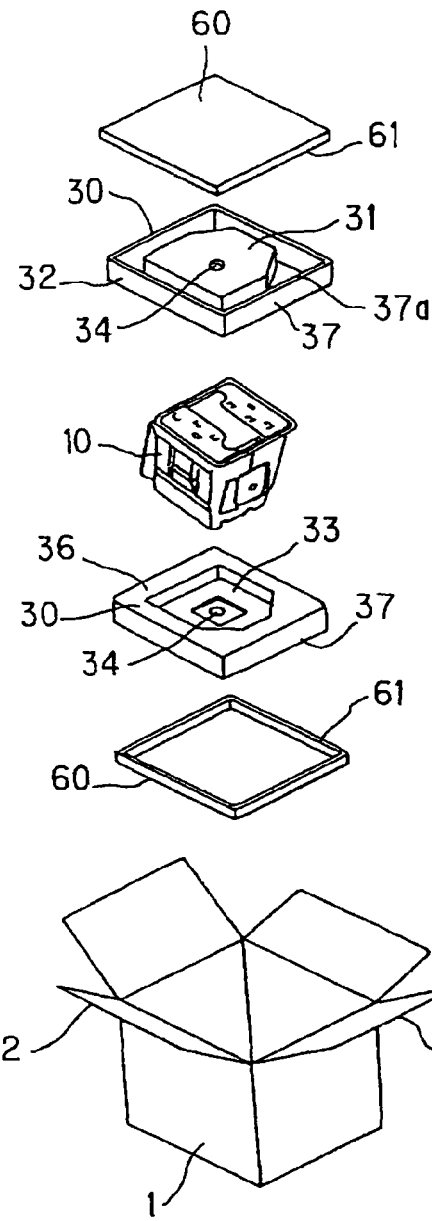
FIG. 8 is an exploded perspective illustrative view showing a packaged state in the third embodiment of a packaged body according to the present invention.

Next, FIG. 8 shows the third embodiment of the present invention. In this case, a plurality of stepped indentations 38 and bellows 39 in surrounding wall 32 of shock absorbing element 31 are omitted while large elongated projections 62 in reinforcement 60 are omitted. Other parts are the same as in the above embodiment so that description is omitted.

Also in the present embodiment, the same operation and effect as in the above embodiment can be expected. In addition, the configurations of shock absorber 30 and reinforcement 60 to be formed are simplified so that it is obvious that the manufacturing and the structure can be simplified.

Figure 9:
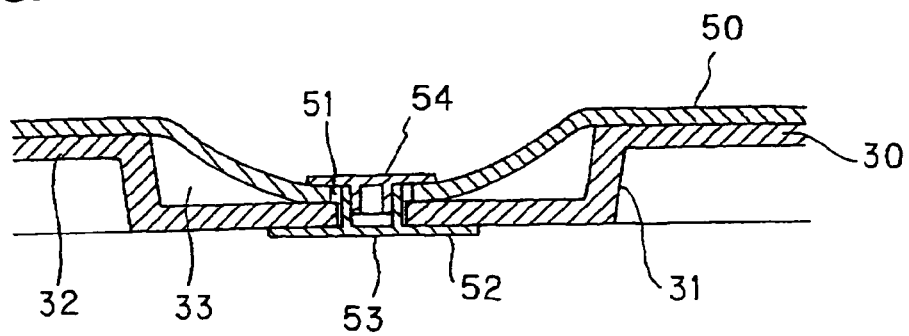
FIG. 9 is a partial sectional illustrative view showing the fourth embodiment of a packaged body according to the present invention.

Next, FIG. 9 shows the fourth embodiment of the present invention. In this case, surrounding wall 32 of shock absorber 30 is adapted to support the peripheral part of elastic member 50 while the other part than the peripheral part is bent into hollowed portion 33 and a passage hole 51 is formed at the center of elastic member 50 thus bent like a bow when sectionally viewed, so that the passage hole 51 of elastic member 50 is fixed to passage opening 34 of hollowed portion 33 by means of a fitting fastener 52 to join shock absorber 30 and elastic member 50.

Fitting fastener 52 includes: a hollow recessed part 53 which, having an approximately hut-shaped section, penetrates through passage opening 34 of hollowed portion 33 and passage hole 51 of elastic member 50; and a solid projected part 54 which, having an approximately hut-shaped section, has a cylindrical projected part that vertically fits into recessed part 53 in a detachable manner. The fastener functions to hold hollowed portion 33 and elastic member 50 between these parts 53 and 54. Other parts are the same as in the above embodiment so that description is omitted.

Also in the present embodiment, the same operation and effect as in the above embodiment can be expected. In addition, it is obvious that the configurations of shock absorbing member 30 and elastic member 50 can be diversified.

Figure 10:
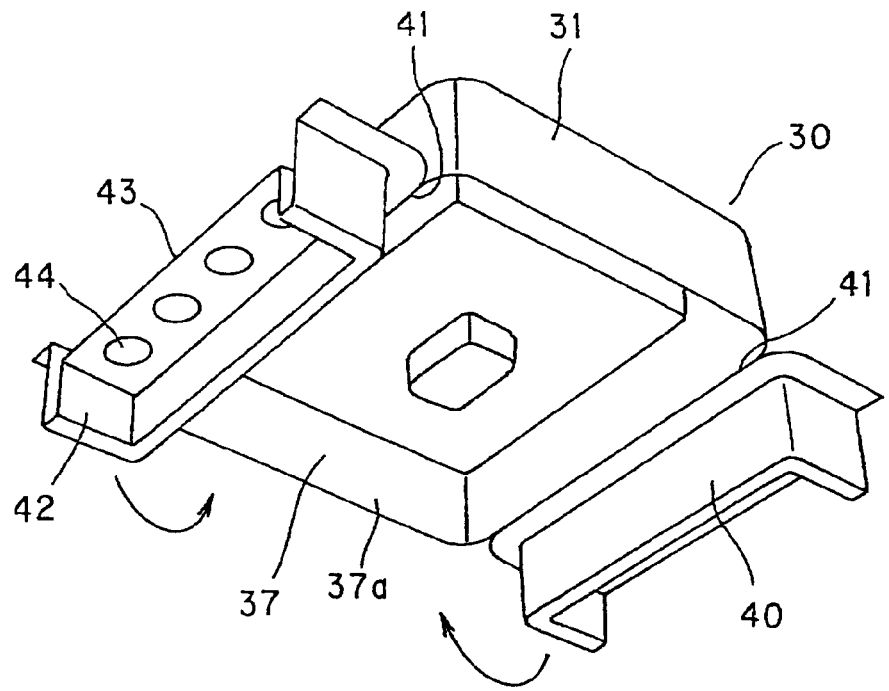
FIG. 10 is a perspective illustrative view showing an unfolded condition of a pair of reinforcing plates in the fifth embodiment of a packaged body according to the present invention.
Figure 11:
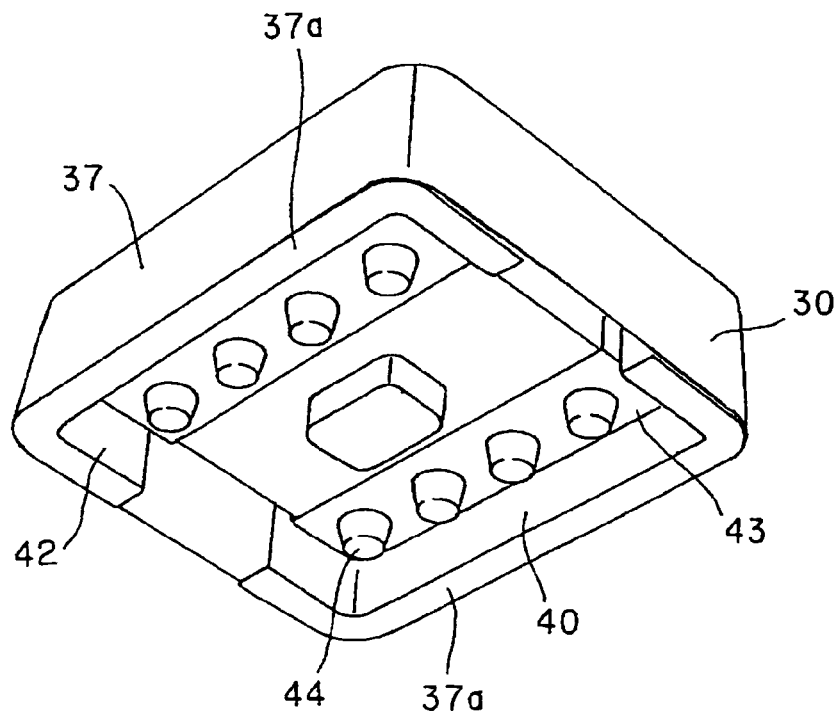
FIG. 11 is a perspective illustrative view showing a folded and layered condition of a pair of reinforcing plates in the fifth embodiment of a packaged body according to the present invention.

Next, FIGS. 10 and 11 show the fifth embodiment of the present invention. In this case, outer wall 37 of surrounding wall 32 of shock absorber 30 is extended toward the rear surface of shock absorbing element 31 so as to form reinforcements 40 arranged on both sides of outer wall 37 that forms surrounding wall 37 and supported pivotably by respective hinges 41 in the inward and outward directions of shock absorber 30, so that each reinforcement 40 is folded back inwards so as to be retracted into the rear side of shock absorber 30 and fitted in layers to the rear side of shock absorber 30 at the time of packaging.

Each reinforcement 40 is joined in a foldable fashion (see the arrows in FIG. 10) to outer wall edge 37a of outer wall 37 by hinge 41, includes a gutter-shaped plate 42 which will be laid over the inner surface of outer wall 37 and reinforce it at the time of packing and a rectangular reinforcing plate 43 which is supported between both the side parts of gutter-shaped plate 42 that oppose each other. This reinforcing plate 43 has a plurality of circular ribs 44 for securing strength arranged in a row apart from one another in its longitudinal direction. Each rib 44 may be formed in a hollow cylindrical or frustoconical shape if required. Other parts are the same as in the above embodiment so that description is omitted.

Also in the present embodiment, the same operation and effect as in the above embodiment can be expected. In addition, it is obvious that the number of reinforcements 60 can be reduced because the strength of shock absorber 30 is enhanced by gutter-shaped plate 42 and reinforcing plate 43, and that the configuration of shock absorber 30 can be diversified.

Figure 12:
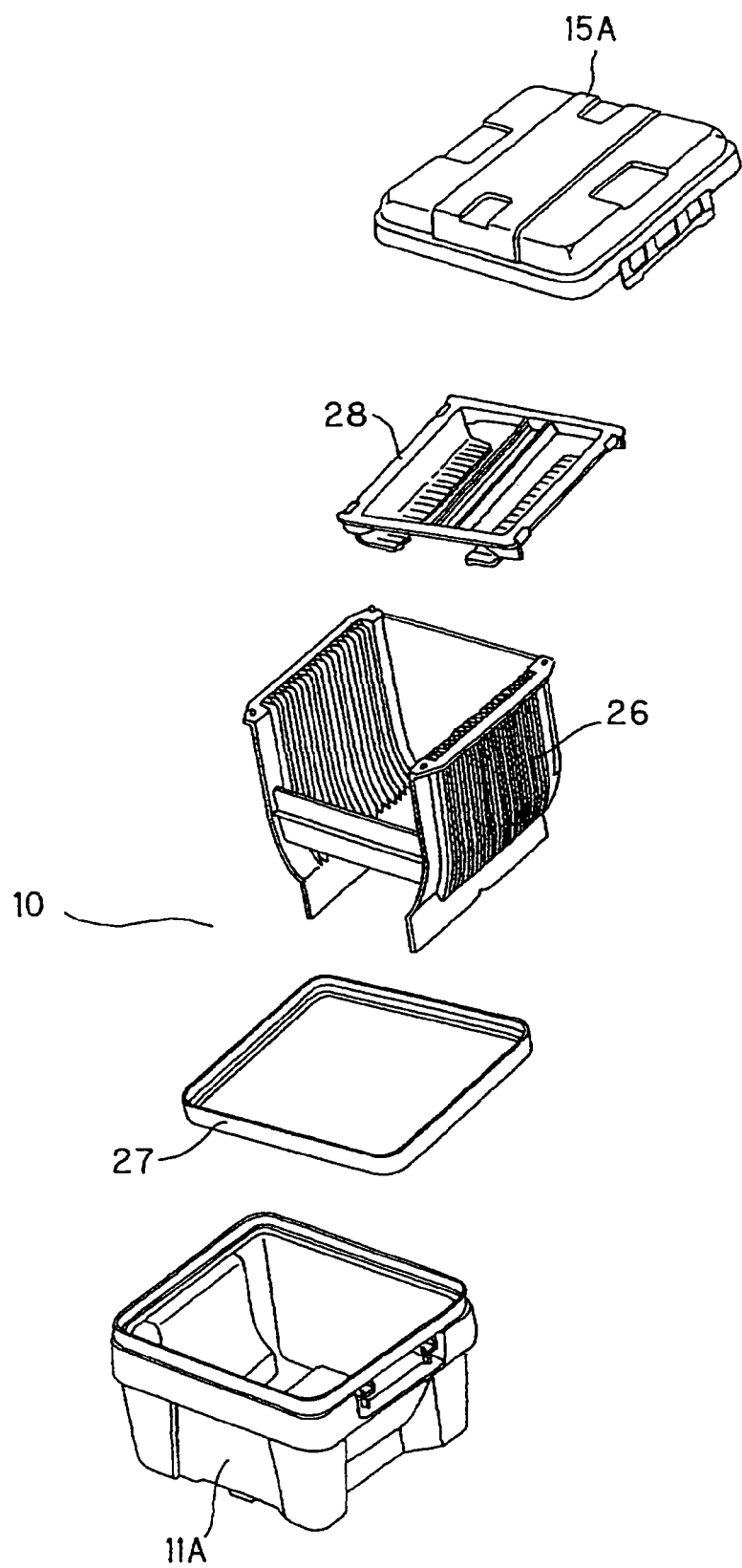
FIG. 12 is an exploded perspective illustrative view showing the sixth embodiment of a packaged body according to the present invention.

Next, FIG. 12 shows the sixth embodiment of the present invention. In this case, instead of the front-open box type substrate storage container 10 for storing 300 mm semiconductor wafers W in alignment, a top-open box type for storing 200 mm semiconductor wafers W in alignment is used.

Substrate storage container 10 of this type includes: an approximately rectangular prism-shaped container body 11A having a bottom; an inner box 26 that is detachably accommodated from above into this container body 11A for storing a plurality of semiconductor wafers W in alignment by holding them by use of alignment grooves; and a door element 15A for opening and closing the open top of container body 11A with an endless gasket 27 therebetween. Attached inside door element 15A is an elastic pressing plate 28 for holding the upper rim of each of stored semiconductor wafers W. Other parts are the same as in the above embodiment so that description is omitted.

Also in the present embodiment, the same operation and effect as in the above embodiment can be expected. In addition, not only the front-open box type substrate storage container 10 but also substrate storage container 10 of a top-open box type can be accommodated, it is hence possible to markedly improve the versatility of the packaged body.

Figure 13:
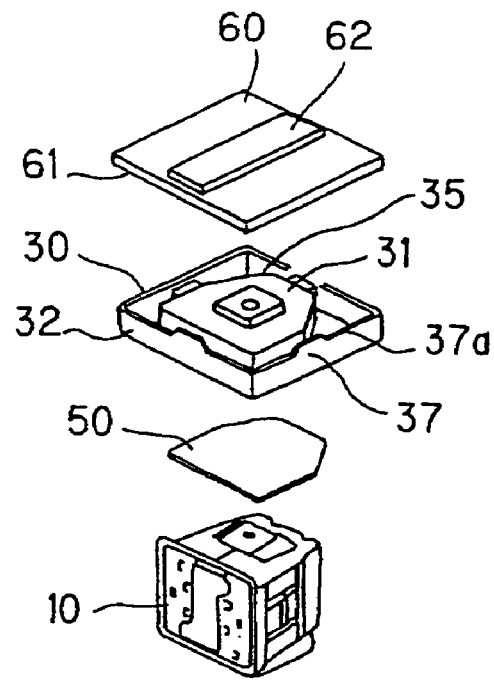
FIG. 13 is an exploded perspective illustrative view showing a state in which a substrate storage container is accommodated horizontally, in another embodiment of a packaged body according to the present invention.
Figure 13:
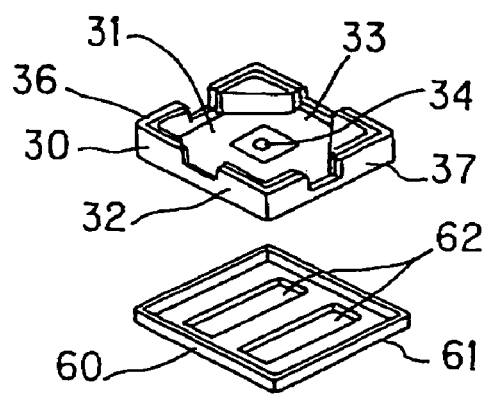
Figure 13:
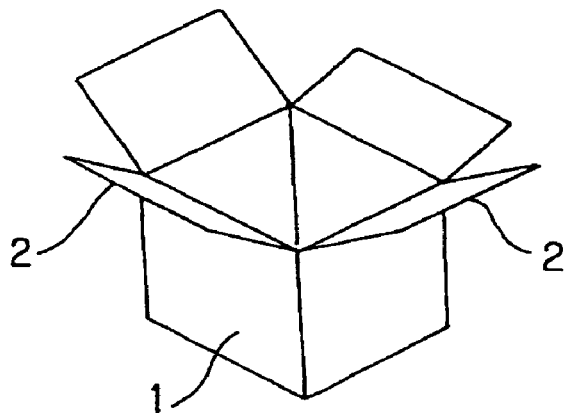

Though in the above embodiment, resinous packaging box 1 is used, the invention should not be particularly limited to this. For example, as long as the problem of clean room pollution and other problems do not arise, slotted-type corrugated cartons and the like, defined by JIS Z 1506 etc. may be used. It is also possible to store and package substrate storage container 10 as it is horizontally placed as shown in FIG. 13. Alternatively, elastic member 50 may be inserted between substrate storage container 10 and one of shock absorbers 30, the number of elastic members 50 may be reduced, or a plurality of elastic members 50 of different materials may be used in combination.

Further, one of shock absorber 30 and elastic member 50 may be formed with a single or a plurality of engagement claws while the other may be formed with a single or plurality of engagement holes so that the engagement claw(s) and hole(s) may detachably mesh each other to improve the handling of the packaged body and the workability of packaging work. It is also possible to have peripheral part 61 of reinforcement 60 held between the peripheral wall of packaging box 1 and outer wall edge 37a of shock absorber 30, closely. Alternatively, it is also possible to have peripheral part 61 of reinforcement 60 held between the wall (including the bottom and ceiling other than peripheral wall) of packaging box 1 and outer wall 37 of shock absorber 30 leaving clearance or create a clearance between the wall of packaging box 1 and peripheral part 61 of reinforcement 60.

It is also possible to curve peripheral part 61 of reinforcement 60 in a J-shaped form instead of bending it vertically obliquely. Further, it is possible to create bellows 39 by folding peripheral part 61 of reinforcement 60. Moreover, it is possible to form peripheral part 61 of reinforcement 60 and the like in an approximately inverted U-shaped section so as to make it engage inner wall 35 or outer wall 37 of shock absorber 30.

EXAMPLES

Next, examples of the packaged bodies of the present invention will be illustrated with a comparative example.

Packaged bodies of examples 1, 2 and 3 and a packaged body of a comparative example were prepared, and drop test, particle increase/decrease confirmation test and vibration test were carried out for these. The result of each test was verified and is shown in Table 1.

The packaged body of example 1 employed the type of the first embodiment. The substrate storage container was a front-open box type having 25 silicon wafers with a diameter of 300 mm stored therein and packed with its door element upward. The packaged body of example 2 employed the type of the second embodiment with its substrate storage container specified in the same way as in the example 1. The packaged body of example 3 employed the type of the third embodiment with its substrate storage container specified in the same way as in the example 1.

In contrast to the above, the packaged body of the comparative example used the type of the third embodiment from which a pair of reinforcements were removed while the substrate storage container was specified in the same way as in example 1.

Drop Test

Figure 14:
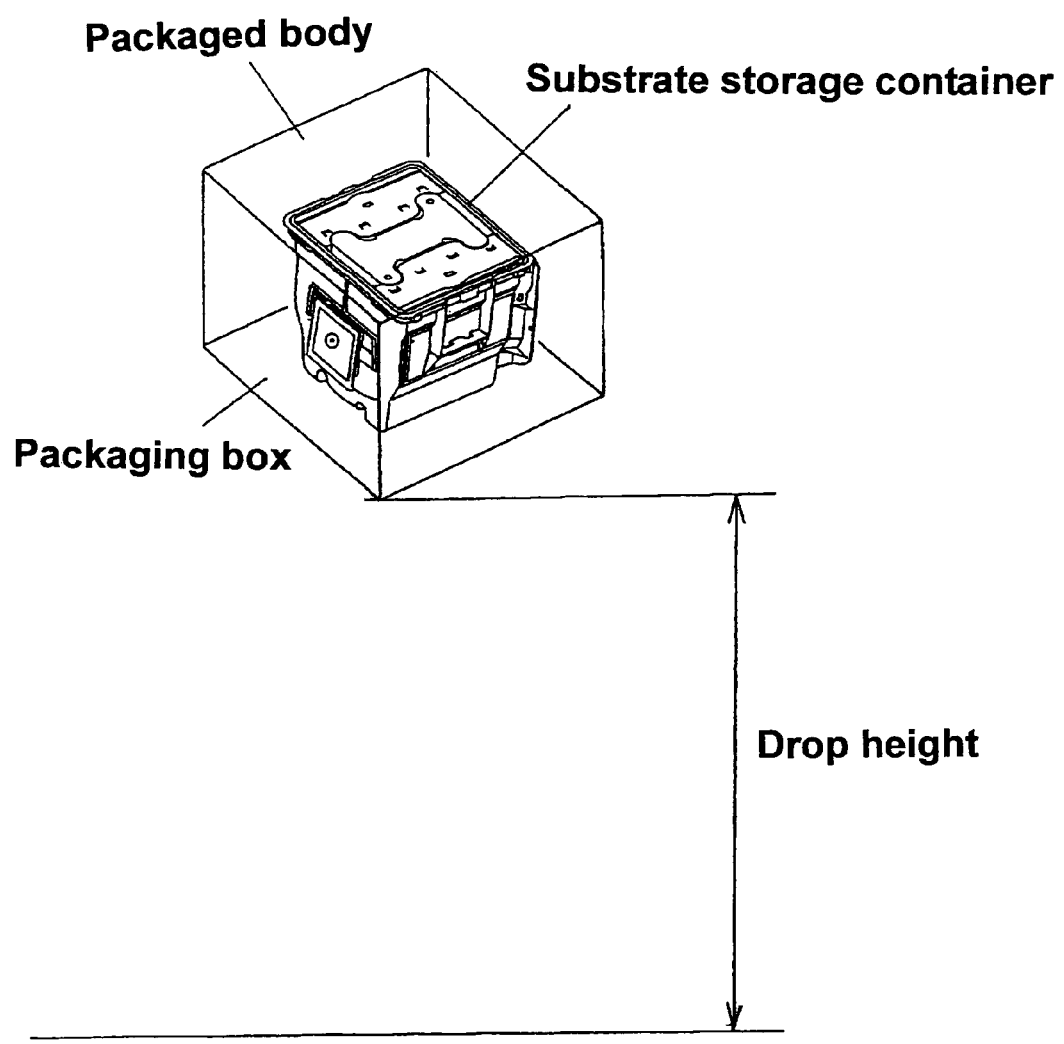
FIG. 14 is a perspective illustrative view showing a drop test in an embodiment of a packaged body according to the present invention.

Conforming to the general rule of performance testing for packaged freight (JIS Z 0200-1999) and the drop test method for packaged freight (JIS Z0202-1994), the packaged bodies of examples 1 to 3 and the packaged body of the comparative example were dropped from a height of 0.6 m by use of a tester, and the breakage condition of the substrate storage container was examined (see FIG. 14). The packaged bodies of the same specifications were prepared, and the similar tests were repeated by increasing the drop height from 0.6 m in increments of 0.1 m to confirm the drop height under which the silicon wafers could be protected in safety.

As the tester for drop test a freight drop tester (DT-100 modified) was used. Ten directions (6 faces-3 edges-1 vertex) were tested for dropping.

Particle Increase/Decrease Confirmation Test

The maximum drop height for each of the packaged bodies of examples 1 to 3 and the packaged body of the comparative example was confirmed. Before drop test, the number of particles on the surface of a silicon wafer was counted using a wafer surface inspection machine, and drop test from the confirmed maximum drop height was carried out. After execution of the drop test, the silicon wafer was taken out from the substrate storage container and checked as to the variation of particles (particles greater than 0.2 µm) in number by the aforementioned wafer surface inspection machine. When increase of five or greater was observed it was determined that an increase was present.

Vibration Test

Each of the packaged bodies of examples 1 to 3 and the packaged body of the comparative example was vibrated under the predetermined conditions using a tester. After the test, the packaged body was unpacked to take out silicon wafers from the substrate storage container to check the deviation of the notch position of the silicon wafer from the reference position (whether a rotation occurred or not). When the deviation was not greater than 5 mm, the deviation was determined to be none.

Test Conditions

Tester:

Vibration tester BF-30UAS, a product of IDEX CO., LTD.
Vibrating condition: frequency 5 Hz-55 Hz-5 Hz
Sweeping time: 60 seconds
Amplitude: 1.5 mm
Vibrating time: 10 minutes
Cycle: 10 cycles
Fixing method: fixing with a band

TABLE 1

|  | Maximum height (m) in drop test | Increase of particles after drop test | Presence of rotation of wafer in vibration test |
|---|---|---|---|
| Example 1 | 1.5 | None | None |
| Example 2 | 1.2 | None | None |
| Example 3 | 1.0 | None | None |
| Comparative example | 0.8 | Present | Present |

The invention claimed is:

1. A packaged body for accommodating a content item in a packaging box, comprising:

a plurality of shock absorbers accommodated in the packaging box for holding the content item therebetween; and a reinforcement for reinforcing at least one shock absorber of the multiple shock absorbers, wherein the shock absorber is formed as a shock absorbing element that fits the content item, a surrounding wall of the shock absorbing element being constructed of an inner wall that is formed along a periphery of the shock absorbing element, a protrusion that is formed from the inner wall so as to project outwards, and an outer wall that is formed from the protrusion so as to be spaced from, and oppose, the inner wall of the shock absorbing element, wherein the shock absorbing element is provided with bellows configured to enclose the content item, and wherein a peripheral part of the reinforcement is obliquely bent in a thickness direction so as to engage the outer wall of the shock absorbing element without a space therebetween.

2. The packaged body according to claim 1, further comprising an elastic member that is interposed between the content item and at least one shock absorber.

3. The packaged body according to claim 1, wherein the packaged body accommodates the content item which is a substrate storage container constructed such that an opening portion of a container body for accommodating semiconductor wafers is opened and closed by a door element, and a retainer for holding rims of semiconductor wafers is attached to the door element of the substrate storage container.

4. The packaged body according to claim 1, wherein the surrounding wall of the shock absorbing element has a plurality of indented portions arranged apart from each other along the circumferential direction.

5. The packaged body according to claim 1, wherein the bellows are formed by folding the protrusion of the surrounding wall of the shock absorbing element.

6. The packaged body according to claim 1, wherein at least one projection is formed in a bottom face of the reinforcement.

7. The packaged body according to claim 5, wherein a differential height between a neighboring top and bottom of the bellows is gradually varied from the outside to the inside.

8. The packaged body according to claim 1, further comprising a passage hole formed in a hollowed portion of the shock absorbing element, to which an elastic member with a passage hole is fixed by a fitting fastener.

* * * * *